United States Patent
Murphy et al.

(10) Patent No.: US 10,746,772 B2
(45) Date of Patent: Aug. 18, 2020

(54) IDENTIFICATION OF CLOUD-TO-GROUND LIGHTNING STROKES WITH CONTINUING CURRENT

(71) Applicant: Vaisala, Inc., Louisville, CO (US)

(72) Inventors: Martin J. Murphy, Boulder, CO (US); Ryan K Said, Broomfield, CO (US)

(73) Assignee: Vaisala, Inc., Louisville, CO (US)

( * ) Notice: Subject to any disclaimer, the term of this patent is extended or adjusted under 35 U.S.C. 154(b) by 244 days.

(21) Appl. No.: 15/848,674

(22) Filed: Dec. 20, 2017

(65) Prior Publication Data

US 2019/0187197 A1 Jun. 20, 2019

(51) Int. Cl.
*G01R 29/08* (2006.01)
*G01W 1/02* (2006.01)
*G01W 1/16* (2006.01)

(52) U.S. Cl.
CPC .......... *G01R 29/0842* (2013.01); *G01W 1/02* (2013.01); *G01W 1/16* (2013.01)

(58) Field of Classification Search
CPC .......... G01W 1/16; G01W 1/02; G01R 29/12; G01R 5/28; G01R 29/24; G01R 29/0842
See application file for complete search history.

(56) References Cited

U.S. PATENT DOCUMENTS

2008/0122424 A1* 5/2008 Zhang ................ G01R 29/0842
324/72
2008/0262732 A1* 10/2008 Davis ..................... G01W 1/16
702/4
2016/0018563 A1* 1/2016 Candor .................. G01W 1/16
324/72
2018/0321422 A1* 11/2018 Stock .................... G01S 5/0263

OTHER PUBLICATIONS

Geostationary Lightning Mapper (GLM) GOES-R series Fact Sheet ; www.goes-r.gov/spacesegment/glm.html.*
https://www.goes-r.gov/spacesegment/glm.html (The Geostationary Lightning Mapper).*
NSSL_The National Severe Storms Laboratory; www.nssl.noaa.gov.*

(Continued)

*Primary Examiner* — Jermele M Hollington
*Assistant Examiner* — Suresh K Rajaputra
(74) *Attorney, Agent, or Firm* — Maschoff Brennan; Paul G. Johnson

(57) ABSTRACT

Systems and methods are disclosed to detect cloud-to-ground (CG) strokes that include or are followed by continuing current. As an example, earth-based lightning data may be generated for one or more lightning pulses detected in an environmental space using multiple earth-based lightning detection sensors. Space-based lightning data may be received for one or more optical signals detected in the environmental space using one or more space-based lightning detection sensors. It may be determined whether one or more lightning pulses is a CG stroke based on the earth-based lightning data. In response to determining that a given one of the one or more lightning pulses is a CG stroke, it may be determined whether the CG stroke includes or is followed by continuing current based on the space-based lightning data.

20 Claims, 4 Drawing Sheets

(56) References Cited

OTHER PUBLICATIONS

Bitzer, P. M. (2017), Global distribution and properties of continuing current in lightning, J. Geophys. Res. Atmos., 122, 1033-1041, doi:10.1002/2016JD025532, 9 pages.

M.J. Murphy et al., Cloud Lightning Performance and Climatology of the U.S. Based on the Upgraded U.S. National Lightning Detection Network, Seventh Conf. on Meteorological Applications of Lightning Data, Amer. Meteorol. Soc. (2015), 11 pages.

D. Mach, et al., Performance assessment of the optical transient detector and lightning imaging sensor, Journal of Geophysical Research, (2007), 16 pages.

Cummer, S. A., & Lyons, W. A. (2004). Lightning charge moment changes in US High Plains thunderstorms. Geophysical research letters, 31(5), 4 pages.

Lu, G., Cummer, S. A., Blakeslee, R. J., Weiss, S., & Beasley, W. H. (2012). Lightning morphology and impulse charge moment change of high peak current negative strokes. Journal of Geophysical Research: Atmospheres, 117(D4), 16 pages.

* cited by examiner

IDENTIFICATION OF CLOUD-TO-GROUND LIGHTNING STROKES WITH CONTINUING CURRENT

BACKGROUND

Lightning pulses may be categorized as cloud-to-ground (CG) strokes or cloud pulses. Continuing current (CC) included in or following CG strokes is a significant problem because CG strokes that include or are followed by CC are more likely to start fires and more likely to cause significant damage than strokes that do not include or are not followed by CC. Typically only a small fraction of all CG strokes include or are followed by CC.

The detection of CC from ground-based lightning detection systems is problematic because it requires sensitive electric or magnetic field measurements at the lower end of the Extremely Low Frequency (ELF; 3-3,000 hertz (Hz)) range. These frequencies are well below the usable sensor sensitivity range of many terrestrial radio lightning locating system (LLS) networks, they attenuate rapidly with distance, and they are typically swamped by anthropogenic noise sources such as that produced by nearby electric power transmission and distribution lines. Consequently, to date, no ground-based observations of CC by a ground-based LLS network have ever been reported.

The subject matter claimed herein is not limited to embodiments that solve any disadvantages or that operate only in environments such as those described above. Rather, this background is only provided to illustrate one example technology area where some embodiments described herein may be practiced.

SUMMARY OF THE DISCLOSURE

Systems and methods are disclosed to detect CG strokes that include or are followed by CC.

In an example embodiment, a method to detect CG strokes that include or are followed by CC includes generating earth-based lightning data for one or more lightning pulses detected in an environmental space using multiple earth-based lightning detection sensors. The method may also include generating space-based lightning data for one or more optical signals detected in the environmental space using one or more space-based lightning detection sensors. The method may also include determining whether each of the lightning pulses is a CG stroke based on the earth-based lightning data. The method may also include, in response to determining that a given one of the lightning pulses is a CG stroke, determining whether the CG stroke includes or is followed by continuing current based on the space-based lightning data.

In another example embodiment, a non-transitory computer-readable medium has computer-readable instructions stored thereon that are executable by a processor device to perform or control performance of operations. The operations may include generating earth-based lightning data for one or more lightning pulses detected in an environmental space using multiple earth-based lightning detection sensors. The operations may also include generating space-based lightning data for one or more optical signals detected in the environmental space using one or more space-based lightning detection sensors. The operations may also include determining whether each of the lightning pulses is a CG stroke based on the earth-based lightning data. The operations may also include, in response to determining that a given one of the lightning pulses is a CG stroke, determining whether the CG stroke includes or is followed by continuing current based on the space-based lightning data In another example embodiment, lightning detection system includes multiple earth-based lightning detection sensors and a processor device. The earth-based lightning detection sensors may be configured to detect one or more lightning pulses in an environmental space. The processor device may be communicatively coupled to the earth-based lightning detection sensors and to one or more space-based lightning detection sensors configured to detect one or more optical signals in the environmental space. The processor device is configured to perform or control performance of operations that may include generating earth-based lightning data for the one or more lightning pulses. The operations may also include generating space-based lightning data for the one or more optical signals. The operations may also include determining whether each of the lightning pulses is a CG stroke based on the earth-based lightning data. The operations may also include, in response to determining that a given one of the lightning pulses is a CG stroke, determining whether the CG stroke includes or is followed by continuing current based on the space-based lightning data.

These example embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

DETAILED DESCRIPTION

Figure 1:
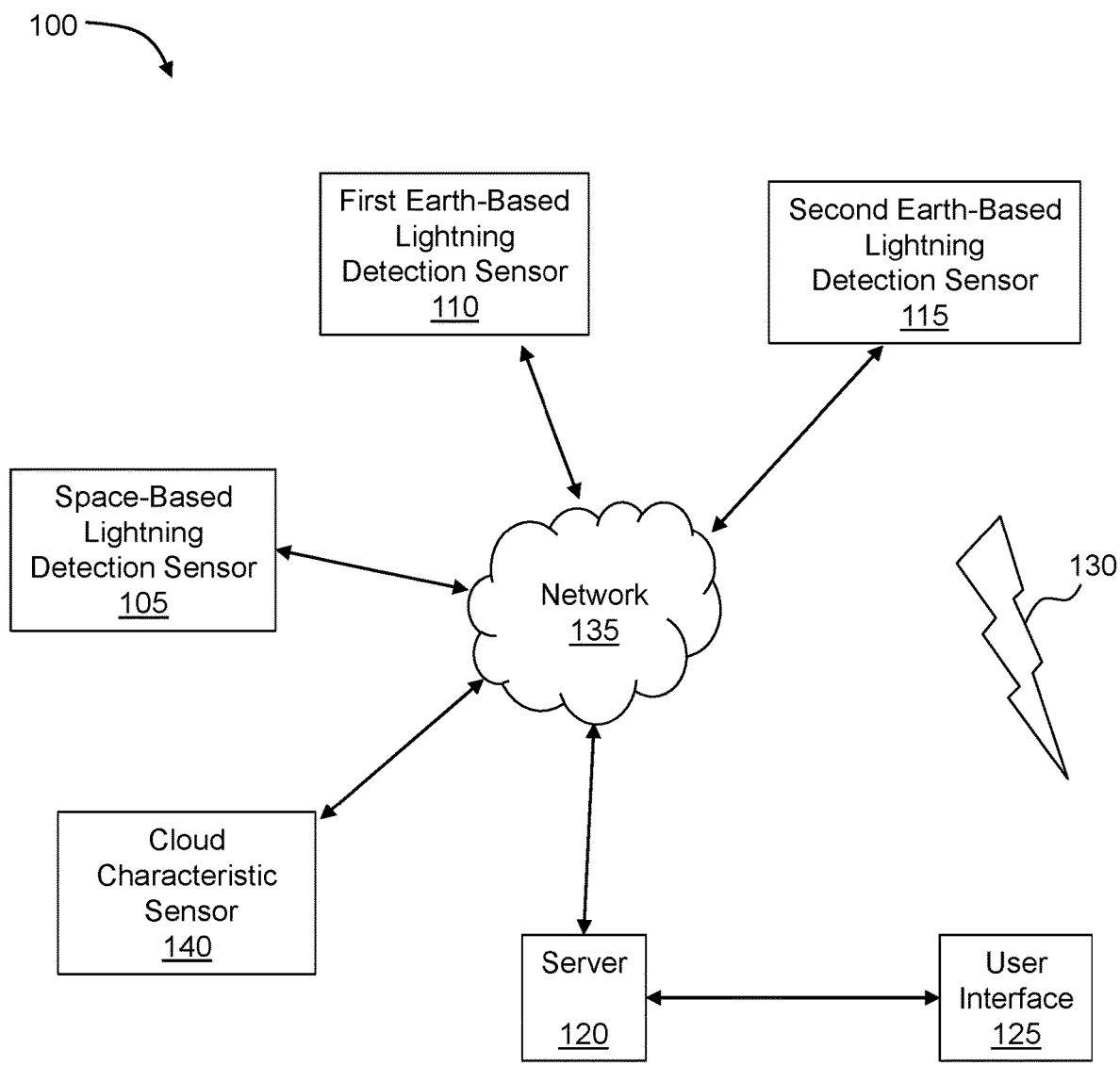
FIG. 1 is an example lightning detection system.

Systems and methods are disclosed to detect CG strokes that include or are followed by CC. Such systems and methods may, in effect, combine optical data and/or other data from space-based lightning detection sensors with ground-based lightning detection observations of CG strokes to determine which CG strokes include or are followed by CC.

CG strokes that are followed by CC produce radio frequency (RF) signals at the lower end of the ELF range. CG strokes that are followed by CC also produce light continuously as long as the CC flows. Recently, the U.S. launched the first geostationary satellite ever to include an optical lightning mapping instrument, known as the Geostationary Lightning Mapper (GLM), followed shortly after by a similar Chinese instrument called the Lightning Mapping Imager (LMI). Over the next several years, the E.U. has plans to put a similar instrument into geostationary orbit. Such space-based lightning detection sensors may provide continuous or nearly continuous observations of light emissions from lightning at time intervals on the order of a couple of milliseconds. Using optical measurements, the nearly continuous light emissions associated with CC may be, to some extent, distinguishable from the mostly impulsive light emissions from CG strokes that do not produce CC, as well as from other in-cloud lightning processes.

Space-based lightning detection sensors, such as GLM, however, may be unable to provide better than about 8-10 kilometer (km) spatial resolution, and thus, the exact location of any given CG stroke is typically not discernible with such instruments. Space-based lightning detection sensors also generally cannot differentiate between CG strokes and in-cloud lightning processes because they may observe diffused optical signals that pass through clouds.

On the other hand, some LLS networks or other earth-based lightning detection systems, such as some from VAISALA, may be capable of geolocating CG strokes to a spatial accuracy of approximately 100 meters, and can accurately differentiate between CG strokes and in-cloud lightning processes. The combination of highly precise CG stroke geolocation and accurate differentiation from in-cloud processes available from some earth-based lightning detection systems with extended optical signals detectable from space available from some space-based lightning detection systems as described herein may provide detailed stroke-level information about CC. Such information may then be highly useful in a variety of sectors, such as wildland firefighting, insurance claim investigation, and electric power and telecommunications utility applications.

Effectively, the only way currently available to conclusively identify CG strokes that include or are followed by CC is in research projects that do not offer real-time information and have very limited coverage in space and time. High-speed video observations near thunderstorms can clearly distinguish between CG strokes that do and do not include or are or are not followed by CC, but such measurements are always limited to the field of view of the camera and cannot cover areas beyond line of sight, which, in practice, is usually a reduced line of sight due to the precipitation generated by the same thunderstorms. High-speed video observations are normally taken during research campaigns only. So-called "slow" electric field change observations reach down to near-DC frequencies, where signals due to CC can be detected. Such measurements are frequently taken in conjunction with high-speed video during research projects, but may be independent of video. In any case, the "slow" electric field change observations are designed to look primarily at the electrostatic component of the field changes produced by lightning processes, but the electrostatic component of the field change attenuates very rapidly with distance. Thus, "slow E" change observations are only useful at distances shorter than about 20 km from the lightning. Neither high-speed video nor "slow E" change observations are suited to wide-area real-time detection of CG strokes that include or are followed by CC.

The combination of continuous optical data from one or more satellite-borne sensors in geostationary orbit with high-precision ground-based identification and geolocation of CG strokes as described herein may be leveraged to identify CG strokes that include or are followed by CC over large areas and in real time.

Reference will now be made to the drawings to describe various aspects of some example embodiments of the disclosure. The drawings are diagrammatic and schematic representations of such example embodiments, and are not limiting of the present disclosure, nor are they necessarily drawn to scale.

FIG. 1 is an example lightning detection system 100 (hereinafter "system 100"), arranged in accordance with at least one embodiment described herein. In general, the system 100 may include one or more earth-based lightning detection sensors and one or more space-based lightning detection sensors. For example, the system 100 may include multiple earth-based lightning detection sensors including a first earth-based lightning detection sensor 110 and a second earth-based lightning detection sensor (collectively referred to as earth-based lightning detection sensors). In these and other embodiments, the system 100 may also include a space-based lightning detection sensor 105. While two earth-based lightning detection sensors 110 and 115 and one space-based lightning detection sensor 105 are shown in FIG. 1, more generally the system 100 may include at least two earth-based lightning detection sensors and at least one space-based lightning detection sensor. For example, the system 100 may include three or more earth-based lightning detection sensors and/or two or more space-based lightning detection sensors.

The system 100 may also include a network 135, a server 120, one or more user interface devices 125, and/or one or more cloud characteristic sensors 140. Although illustrated as discrete blocks, various blocks may be divided into additional blocks, combined into fewer blocks, or eliminated, depending on the desired implementation.

Each of the earth-based lightning detection sensors 110 and/or 115 may include any type of earth-based lightning detection sensor such as, for example, a VAISALA LS7002 lightning detection sensor or other suitable lightning detection sensor. In some embodiments, one or more of the earth-based lightning detection sensors 110 and/or 115 may include the earth-based lightning detection sensor 200 of FIG. 2. In these and other embodiments, one or more of the earth-based lightning detection sensors 110 and/or 115 may include one or more components of the earth-based lightning detection sensor 200 of FIG. 2.

The earth-based lightning detection sensors 110 and/or 115 may be distributed throughout an environmental space to generate earth-based lightning data about one or more lightning sources 130 within the environmental space. In some embodiments, for example, the earth-based lightning detection sensors 110 and/or 115 may generate the earth-based lightning data about the lightning source 130 by detecting lightning pulses emitted by the lightning sources 130 within the environmental space. A single lightning source 130 is depicted in FIG. 1 for simplicity.

The space-based lightning detection sensor 105 may include any type of space-based lightning detection sensor such as, for example, the Geostationary Lightning Mapper (GLM), any other optical sensor in geostationary orbit, or other suitable space-based lightning detection sensor. The space-based lightning detection sensor 105 may generate space-based lightning data about the lightning sources 130 within the environmental space. In some embodiments, for example, the space-based lightning detection sensor 105 may generate the space-based lightning data about the lightning source 130 by detecting optical signals emitted by the lightning sources 130 within the environmental space.

Each lightning source 130 may include a discharge with movement of charge in the earth's atmosphere or between the atmosphere and earth, and which generates or emits electromagnetic field (EMF) emissions that may be detected by the earth-based lightning detection sensors 110 and 115 and/or the space-based lightning detection sensor 105. The EMF emissions may include one or both of RF emissions and optical emissions. RF emissions may generally include EMF emissions with a frequency somewhere in a range from about 20 kilohertz (kHz) to about 300 gigahertz (GHz). RF emissions from a lightning source may be referred to as lightning pulses. Optical emissions may generally include EMF emissions in the near-infrared and/or visible spectrum (about 200-750 terahertz (THZ) or 400-1500 nanometers (nm)). In an example embodiment, the optical emissions detected by the space-based lightning detection sensor 105 may more particularly include EMF emissions with a wavelength of, e.g., 777.4 nm. In other embodiments, the optical emissions detected by the space-based lightning detection sensor 105 may include other and/or additional wavelengths. Optical emissions from a lightning source may be referred to as optical signals.

Each of the lightning sources 130 may include a cloud-to-ground (CG) lightning discharge, or an in-cloud (IC) lightning discharge. A CG lightning discharge may include an electrical discharge between a cloud and the ground. An IC lightning discharge may include an electrical discharge within a cloud, referred to as an intracloud lightning discharge, an electrical discharge between two clouds, referred to as a cloud-to-cloud lightning discharge, or an electrical discharge between a cloud and the air, referred to as a cloud-to-air lightning discharge. The lightning pulses emitted by CG lightning discharges may be referred to as CG return strokes, or simply CG strokes. The lightning pulses emitted by IC lightning discharges that do not reach ground may be referred to as cloud pulses.

Accordingly, each lightning source 130 may emit a lightning pulse, multiple lightning pulses, an optical signal, multiple optical signals, and/or other lightning emissions that may be detected by the earth-based lightning detection sensors 110 and 115 and/or the space-based lightning detection sensor 105. In general, a lightning pulse may have a duration on the order of a few microseconds (µs) or more, depending on how "pulse" is defined. The lightning pulses in the lightning data generated by the earth-based lightning detection sensors 110 and 115 may be grouped into lightning flashes using any suitable algorithm, such as the algorithm described in M. J. Murphy et al., Cloud Lightning Performance and Climatology of the U.S. Based on the Upgraded U.S. National Lightning Detection Network, Seventh Conf. on Meteorological Applications of Lightning Data, Amer. Meteorol. Soc. (2015), which is herein incorporated by reference in its entirety. A lightning flash may have a duration of, e.g., a hundred milliseconds (ms) or more and may be made up of multiple lightning pulses. Additionally or alternatively, the optical signals detected from space may be grouped into lightning flashes using any suitable algorithm, such as the algorithm described in D. Mach, et al., Performance assessment of the optical transient detector and lightning imaging sensor, Journal of Geophysical Research, (2007), which is herein incorporated by reference in its entirety.

Lightning pulses may each have a type. For instance, the type of each lightning pulse may be a cloud pulse or a CG stroke. Any lightning pulse emitted by a lightning discharge that does not reach the ground may be categorized as a cloud pulse. Any lightning pulse emitted by a lightning discharge that reaches the ground may be categorized as a CG stroke. The type of each of the lightning pulses may be determined from the earth-based lightning data generated by the earth-based lightning detection sensors 110 and/or 115 responsive to detecting the lightning pulses. For instance, a shape of a plot of a time-varying voltage detected for a lightning pulse, or other information in or derived from earth-based lightning data generated for the lightning pulse, may be used to determine the type of each lightning pulse.

Some lightning pulses emitted by lightning sources 130 as CG strokes may include or be followed by continuing current (CC). CC may include an electrical current that flows from the cloud to the ground for a period of time due to the CG stroke. For example, CC may flow between the cloud and the ground for a period of time equal to or greater than 10 milliseconds (ms). Additionally or alternatively, CC that is included in or follows a return stroke may include low current values. In some embodiments, CC may include between ten and several hundred amperes. Furthermore, CC may flow for ten to several hundred milliseconds. Continuing current may remove charge from a region within the cloud, whereas return stroke current (e.g., the current that flows during the return stroke) may be impulsive, usually lasting less than three milliseconds, and may remove charge deposited by a preceding return stroke leader.

Return stroke current typically poses less of a risk for damage through heating metal elements than continuing current. The energy delivered to a good conductor is proportional to the total charge transferred, which is typically higher in continuing currents than return stroke currents. In some embodiments, return stroke current may transfer a charge comparable to a charge of continuing current. In the cases of strikes to metal, return stroke current with comparable charge transfer may still be less destructive than continuing currents, since the short durations limit the heat penetration. Nevertheless, a total charge transferred by a return stroke current may be a useful parameter in some scientific applications, including sprite production (Cummer, S. A., & Lyons, W. A. (2004). Lightning charge moment changes in US High Plains thunderstorms. *Geophysical research letters*, 31(5)) and lightning flash morphology (Lu, G., Cummer, S. A., Blakeslee, R. J., Weiss, S., & Beasley, W. H. (2012). Lightning morphology and impulse charge moment change of high peak current negative strokes. *Journal of Geophysical Research: Atmospheres*, 117(D4)).

In some embodiments, the earth-based lightning detection sensors 110 and/or 115 may detect low frequency lightning pulses emitted by the lightning sources 130. For example, the earth-based lightning detection sensors 110 and/or 115 may detect the lightning pulses at frequencies between thirty kHz and three hundred kHz. Additionally or alternatively, the earth-based lightning detection sensors 110 and/or 115 may detect the lightning pulses at frequencies equal to or less than thirty kHz. Additionally or alternatively, the earth-based lightning detection sensors 110 and/or 115 may detect the lightning pulses at frequencies equal to or greater than three hundred kHz.

In some embodiments, one or more of the earth-based lightning detection sensors 110 and/or 115 may detect time domain, low frequency lightning pulses that may have (and/or whose data may have), for example, a specific shape, a specific time of arrival, and/or a specific direction of arrival from the one or more lightning sources 130.

In some embodiments, the earth-based lightning detection sensors 110 and/or 115 may generate the earth-based lightning data for detected lightning pulses. The earth-based lightning data, for example, may include time-varying voltage or other time-varying measurements of the detected lightning pulses, times of occurrence of the lightning pulses, durations of the lightning pulses, the timing of when the lightning pulses are detected, the magnitude of the lightning pulses, the polarity of the lightning pulses, the type of lightning pulses, global positioning system (GPS) data associated with the earth-based lightning detection sensors 110 and/or 115, angle or direction of arrival data, data from which one or more of the foregoing may be determined or derived, or other earth-based lightning data. In some embodiments, the earth-based lightning detection sensors 110 and/or 115 may include a camera configured to capture video data of detected lightning pulses. In some embodiments, locations of detected lightning pulses included in or derived from the earth-based lightning data may have a spatial resolution of about 100 meters, or more or less than 100 meters.

In some embodiments, the earth-based lightning detection sensors 110 and/or 115 may detect lightning sources 130 and/or lightning pulses emitted by the lightning sources 130 at long ranges such as, for example, ranges greater than 500 km, 1000 km, 1500 km, 1750 km, etc.

In some embodiments, the space-based lightning detection sensor 105 may detect the lightning sources 130 and/or optical signals emitted by the lightning sources 130 and received by the space-based lightning detection sensor 105. Specifically, in some embodiments, the space-based lightning detection sensor 105 may measure the optical signals from lightning sources 130 by looking down at cloud tops. The optical signals may contain no information that can be used to discern the lightning type or polarity on a pulse-by-pulse basis. In these and other embodiments, the space-based lightning detection sensor 105 may generate the space-based lightning data for detected optical signals. The space-based lightning data, for example, may include, times of occurrence of the optical signals, locations of the optical signals, durations of the optical signals, timing of when the optical signals are detected, intensity of the light emitted by the detected optical signals, the areal extent of the detected optical signals, data from which one or more of the foregoing may be determined or derived, grouping according to optical signals, or other space-based lightning data. Alternatively or additionally, the space-based lightning data may include geolocation data for detected optical signals (or more particularly their location of origin), or geolocation data for detected optical signals may be derived from the space-based lightning data. In some embodiments, locations of detected optical signals included in or derived from the space-based lightning data may have a spatial resolution of about 8-10 km, or more than 10 km or less than 8 km.

In some embodiments, the earth-based lightning detection sensors 110 and/or 115 may provide geolocation capabilities to the server 120 via the network 135 that specify the geolocation of the respective earth-based lightning detection sensors 110 or 115.

In some embodiments, the network 135 may connect the earth-based lightning detection sensors 110 and/or 115 and/or the space-based lightning detection sensor 105 to the server 120. In some embodiments, the network 135 may be a wireless network that includes one or more wireless networks, such as, for example a wireless local area network (LAN), a cellular network, a long-term evolution (LTE) network, a code division multiple access (CDMA) network, a global system for mobile communication (GSM) network, a microwave network, a long range Wi-Fi network, a satellite network, or other suitable network. In some embodiments, the network 135 may include a wired LAN or Ethernet connection, or other wired connections for serial or parallel data transmission from the earth-based lightning detection sensors 110 and/or 115 to the server 120. In some embodiments, the network 135 may include both wireless and wired components. For example, the space-based lightning detection sensor 105 and/or the cloud characteristic sensor 140 may be communicatively coupled to the network 135 via one or more wireless connections and the earth-based lightning detection sensors 110 and/or 115 and the server 120 may be communicatively coupled to the network 135 via one or more wired connections.

Figure 4:
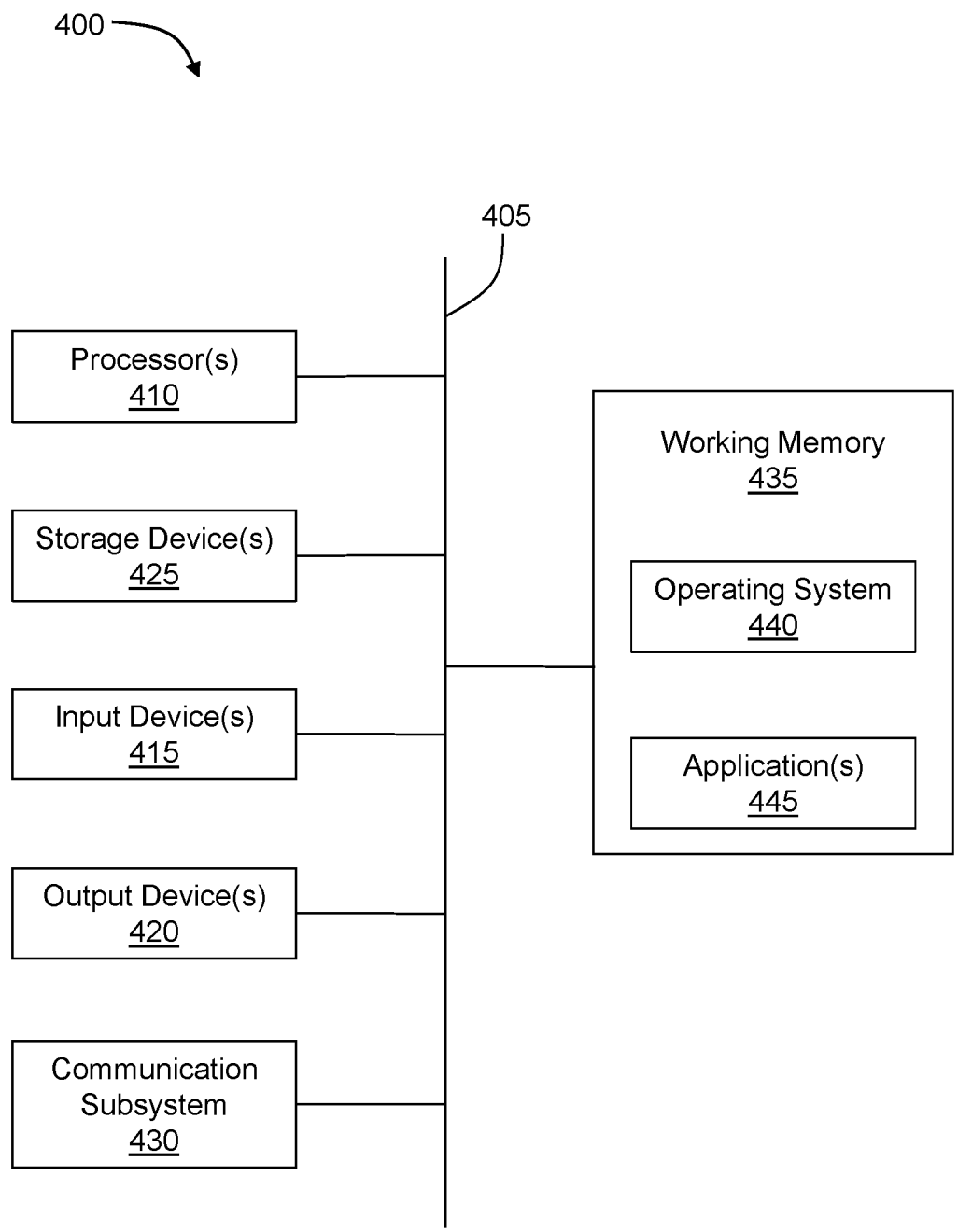
FIG. 4 shows an example computational system, all arranged in accordance with at least one embodiment described herein.

In some embodiments, the server 120 may include one or more components of computational system 400 of FIG. 4. In some embodiments, the server 120 may include one or more servers located in one or more locations and/or located at various distributed locations (e.g., a cloud server).

In some embodiments, the server 120 may receive the earth-based lightning data from all or some of the earth-based lightning detection sensors 110 and/or 115 via the network 135. In these and other embodiments, the server 120 may also receive the space-based lightning data from the space-based lightning detection sensor 105 via the network 135. In some embodiments, the server 120 may also receive cloud characteristics data from the cloud characteristic sensor 140 via the network 135. In some embodiments, the server 120 may include a database where the earth-based lightning data received from the earth-based lightning detection sensors 110 and/or 115 and the space-based lightning data received from the space-based lightning detection sensor 105 and/or the cloud characteristics data from cloud characteristic sensor 140 may be stored.

In some embodiments, the server 120 may include a processor (or one or more processors) programmed to process and/or analyze the earth-based lightning data received from the earth-based lightning detection sensors 110 and/or 115, and/or the space-based lightning data received from the space-based lightning detection sensor 105, and/or cloud characteristics data from the cloud characteristic sensor 140, and/or stored in the database of the server 120.

In some embodiments, the server 120 may geolocate (e.g., determine a position of) the lightning sources 130, or locations of origin of the corresponding lightning pulses, based on the earth-based lightning data received from the earth-based lightning detection sensors 110 and/or 115. For example, the server 120 may be configured to determine a position of the lightning sources 130, e.g., using a time difference of arrival (TDOA) or triangulation method based on GPS or other position data and timing data included in the earth-based lightning data received from the earth-based lightning detection sensors 110 and/or 115. Such methods may consider the time of arrival of the same lightning pulse emitted by the lightning source 130 at the two (or more) earth-based lightning detection sensors 110 and/or 115, locations, and/or angle/direction data. Alternatively or additionally, the server 120 may determine a time of occurrence of the lightning sources 130, or times of occurrence of the corresponding lightning pulses and/or corresponding optical signals, based on the earth-based lightning data received from the earth-based lightning detection sensors 110 and/or 115 and/or based on the space-based lightning data received from the space-based lightning detection sensor 105.

In some embodiments, the server 120 may determine whether multiple optical signals detected by the space-based lightning detection sensor 105 are part of a contiguous group. Specifically, the server 120 may determine whether multiple optical signals detected by the space-based lightning detection sensor 105 occurred with time gaps between each of the optical signals that are equal to or less than a threshold time limit. In some embodiments, the threshold time limit may be equal to or less than 2 ms. In other embodiments, the threshold time limit may be greater than 2 ms. Additionally or alternatively, the server 120 may determine whether the multiple optical signals detected by the space-based lightning detection sensor 105 occurred within a distance of each other that is equal to or less than a threshold distance limit. In some embodiments, the threshold distance limit may be equal to or less than 20 km. In other embodiments, the threshold distance limit may be more than 20 km.

In an example, the space-based lightning detection sensor 105 may detect a first optical signal, a second optical signal, and a third optical signal. The first optical signal may be detected and assigned a first time value and a first location, the second optical signal may be detected and assigned a second time value and a second location. If the difference between the first time value and the second time value is equal to or less than the threshold time limit and the distance between the first location and the second location is equal to or less than the threshold distance limit, the server 120 may determine that the first optical signal and the second optical signal are part of a contiguous group. Additionally, the third optical signal may be detected and assigned a third time value and a third location, and if the difference between the third time value and at least one of the first time value or the second time value is also less than or equal to the threshold time limit and the distance between the third location and at least one of the first location or the second location is less than or equal to the threshold distance limit, the server 120 may determine that the first optical signal, the second optical signal, and the third optical signal are all part of a contiguous group. Alternatively, if the differences between the third time value and each of the first time value and the second time value are greater than the threshold time limit and/or the distances between the third location and each of the first location and the second location are greater than the threshold distance limit, the server 120 may determine that the third optical signal is not a part of the contiguous group. The server 120 may generate data indicating which optical signals detected by the space-based lightning detection sensor 105 are part of contiguous groups in the space-based lightning data.

In some embodiments, the server 120 may be configured to determine which lightning pulses are CG strokes and which are cloud pulses based on the earth-based lightning data. For instance, a shape of a plot of a time-varying voltage detected for a lightning pulse, or other information in or derived from earth-based lightning data generated for the lightning pulse, may be used by the server 120 to determine the type of each lightning pulse, e.g., whether each lightning pulse is a CG stroke or a cloud pulse.

In these and other embodiments, and for those lightning pulses determined to be CG strokes from the earth-based lightning data, the server 120 may be configured to determine if each of the CG strokes includes or is followed by CC based on the space-based lightning data. For example, the server 120 may determine whether contiguous groups having a time duration have been detected by the space-based lightning detection sensor 105 and if the time duration exceeds a time duration threshold. The time duration may be determined starting from a time assigned to a CG stroke. For example, a CG stroke may be determined to include or be followed by CC if a contiguous group of optical signals associated (or correlated) with the CG stroke is observed that has a duration of at least 8 ms starting from the time assigned to the CG stroke. In other embodiments, the time duration threshold may be greater or less than 8 ms. Additionally or alternatively, the server 120 may determine that a CG stroke includes or is followed by CC if a contiguous group of optical signals associated (or correlated) with the CG stroke includes at least one optical signal within the time duration following the CG stroke with an intensity that exceeds a threshold intensity. For example, a CG stroke may be determined to include or be followed by CC if the corresponding intensity is greater than or equal to $10^{-15}$ J. In other embodiments, the intensity threshold may be greater or less than $10^{-15}$ J. The time assigned to any given CG stroke may include the time of occurrence of the CG stroke, which may be included in or derived from the earth-based lightning data received from the earth-based lightning detection sensors 110, 115.

In some embodiments, the server 120 may determine that a CG stroke includes or is followed by CC if a sum of the intensity of multiple detected optical signals within a contiguous group associated (or correlated) with the CG stroke starting from the time assigned to the CG stroke exceeds an intensity sum threshold. For example, if the sum of the intensity of the detected optical signals in the contiguous group is greater than or equal to $10^{-14}$ J, the server 120 may determine that the CG stroke includes or is followed by CC. In other embodiments, the intensity sum threshold may be greater or less than $10^{-14}$ J. Additionally or alternatively, the CG stroke may be determined to include or be followed by CC if both the corresponding intensity exceeds the threshold intensity and the corresponding time duration exceeds the threshold duration.

Additionally or alternatively, the server 120 may determine that a CG stroke includes or is followed by CC if an areal extent of any of the detected optical signals within a contiguous group associated (or correlated) with the CG stroke starting from the time assigned to the CG stroke exceeds an areal threshold. For example, the CG stroke may be determined to include or be followed by CC if the corresponding areal extent of any of the detected optical signals in the contiguous group is equal to or greater than 200 $km^2$. In other embodiments, the areal threshold may be greater than or less than 200 $km^2$.

Additionally or alternatively, the server 120 may determine that a CG stroke includes or is followed by CC if a sum of the areal extents of detected optical signals within a contiguous group associated (or correlated) with the CG stroke starting from the time assigned to the CG stroke exceeds an areal sum threshold. For example, if the sum of the corresponding areal extents is equal to or exceeds 1000 $km^2$, the CG stroke may be determined to include or be followed by CC. In other embodiments, the areal sum threshold may be greater than or less than 1000 $km^2$.

Additionally or alternatively, the server 120 may determine that a CG stroke includes or is followed by CC if any two or more thresholds are exceeded based on time duration, intensity of one or more detected optical signals, sum of intensity of the detected optical signals, areal extent of one or more detected optical signals, or sum of areal extents of the detected optical signals, observed within a contiguous group associated (or correlated) with the CG stroke starting from the time assigned to the CG stroke. In these and other embodiments, the server 120 may execute, perform, or control performance of one or more of the methods or operations described herein.

In some embodiments, the earth-based lightning data may include cloud pulses detected during a period of time following a CG stroke. In some embodiments, the earth-based lightning data may include estimates of altitude of detected cloud pulses. In some embodiments, the server 120 may determine that a CG stroke includes or is followed by CC on the basis of the altitude of one or more cloud pulses detected by the earth-based lightning detection sensor 110 and/or 115 in addition to the space-based lightning data.

In some embodiments, additional space-based data relating to the characteristics of clouds that produce the CG stroke may be available. Such cloud characteristics may include a cloud top altitude, a cloud top temperature, a cloud amount, and whether the cloud top consists primarily of ice crystals or supercooled liquid water droplets. Such space-based cloud characteristics data may be generated by, e.g., the cloud characteristic sensor 140 of FIG. 1. In some embodiments, thresholds on the optical signal information detected by the space-based lightning detection sensor 105 may be adjusted dynamically based on one or more of the cloud characteristics. For example, the intensity of one or more optical signals within a contiguous group associated (or correlated) with a CG stroke starting from the time assigned to the CG stroke may need to exceed a first intensity threshold of $10^{-15}$ J if the cloud top altitude is determined to be at or below a first cloud top altitude threshold and the cloud top is determined to be composed primarily of supercooled liquid water droplets. In some embodiments, the first cloud top altitude threshold may be equal to or less than five km. In other embodiments, the first cloud top altitude threshold may be greater than five km. In other embodiments, the first intensity threshold may be less than or greater than $10^{-15}$ J. As another example, the intensity of one or more optical signals may need to exceed a different second intensity threshold of $10^{-14}$ J if the cloud top altitude is determined to be at or above a second cloud top altitude threshold and the cloud top is determined to be composed primarily of ice crystals. In some embodiments, the second cloud top altitude threshold may be equal to or greater than ten km. In other embodiments, the second cloud top altitude threshold may be less than ten km. In other embodiments, the second intensity threshold may be less than or greater than $10^{-14}$ J.

In some embodiments, the user interface device 125 may include any device that can access data stored at the server 120 such as, for example, a computer, a laptop, a smartphone, a tablet, or other suitable device. In some embodiments, the user interface device 125 may be used to retrieve and/or present the earth-based lightning data from the earth-based lightning detection sensors 110 and/or 115, the space-based lightning data from the space-based lightning detection sensor 105, data that identifies which CG strokes include or are followed by CC, or other measurements and information related to the lightning sources 130, lightning pulses, and/or optical signals to a user.

In some embodiments, the cloud characteristic sensor 140 may be configured to detect clouds in the environmental space and/or characteristics of the clouds in the environmental space. The cloud characteristic sensor 140 may be a space-based sensor (e.g., on a satellite in orbit around the Earth) and may optionally be co-located with the space-based lightning detection sensor 105. In other embodiments, the cloud characteristic sensor 140 may be an earth-based sensor. The cloud characteristic sensor 140 may output a raw sensor feed to the server 120 which may generate cloud characteristics data from the raw sensor feed. Alternatively or additionally, the cloud characteristic sensor 140 may generate the cloud characteristics data and then send it to the server 120. The cloud characteristics data may include, for a given cloud, one or more of a cloud top altitude, a cloud top temperature, a cloud amount, and whether the cloud top consists primarily of ice crystals or supercooled liquid water droplets.

Figure 2:
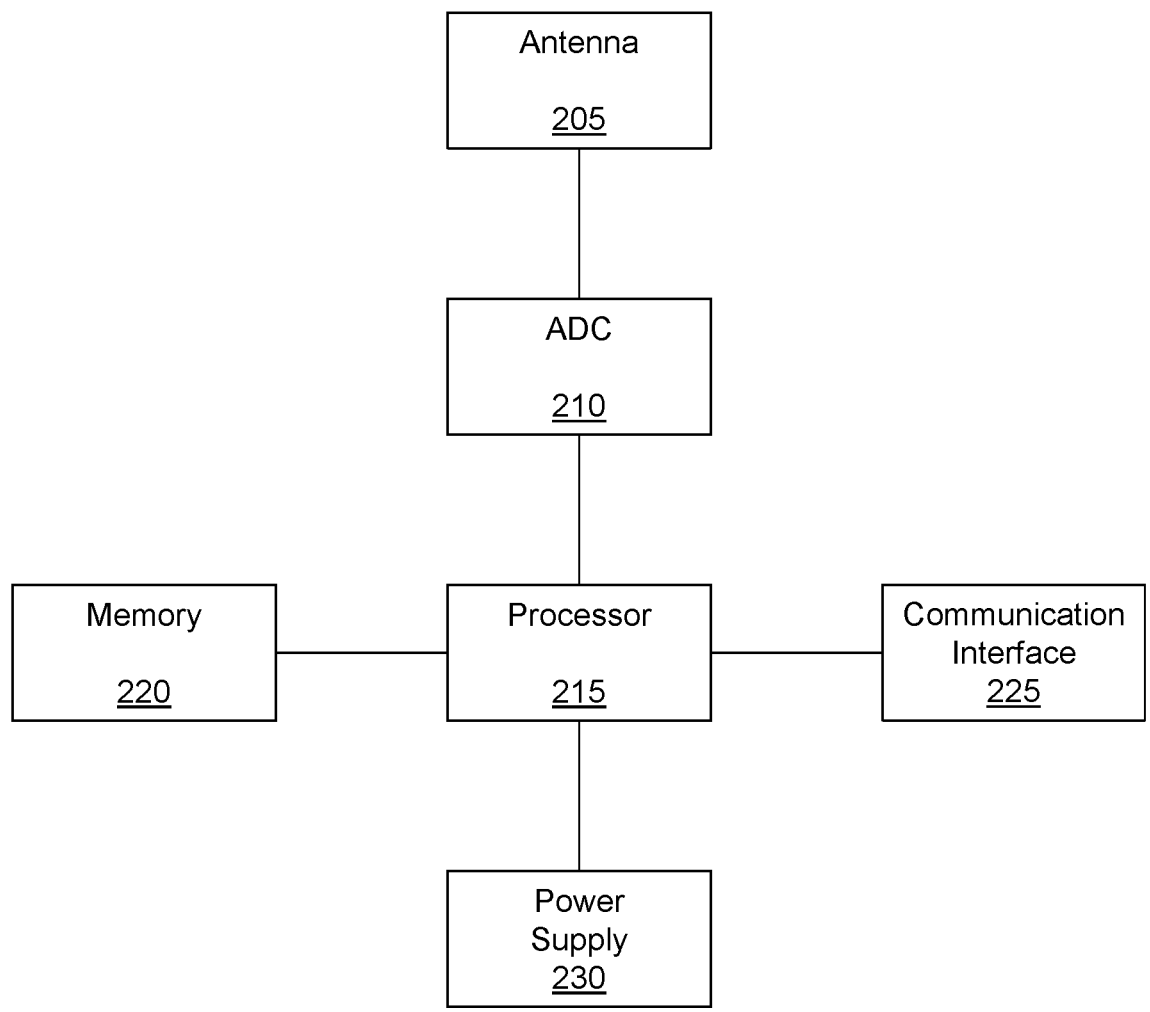
FIG. 2 is an example earth-based lightning detection sensor.

FIG. 2 is an example earth-based lightning detection sensor 200, arranged in accordance with at least one embodiment described herein. The earth-based lightning detection sensor 200 may include or correspond to one or more of the earth-based lightning detection sensors 110 and/or 115 of FIG. 1. In at least one embodiment, the earth-based lightning detection sensor 200 may include an antenna 205, an analog-to-digital converter (ADC) 210, a processor 215, a memory 220, a communication interface 225, and/or a power supply 230. Various other components may also be included.

In some embodiments, the earth-based lightning detection sensor 200 may, for example, detect lightning pulses emitted by lightning discharges in an environmental space and/or may measure different characteristics of the lightning pulses. For example, the earth-based lightning detection sensor 200 may receive and detect at the antenna 205 lightning pulses at one or more of low frequency (LF), very low frequency (VLF), and/or ultra low frequency (ULF). LF may include frequencies in the range 30 kHz to 300 kHz. VLF may include frequencies in the range 3 kHz to 30 kHz. ULF may include frequencies in the range 0.3 kHz to 3 kHz. In other embodiments, the earth-based lightning detection sensor 200 may receive and detect at the antenna 205 lightning pulses at other frequencies instead of or in addition to the foregoing range of detection frequencies. For instance, the detection frequencies may extend at least partially into medium frequency (MF) (300 kHz to 3 MHz). The antenna 205 may output, for each detected lightning pulse, an analog signal that represents the lightning pulse.

In some embodiments, the ADC 210 may convert the received analog signal for each lightning pulse into a digital signal or digital data. The digital signal or digital data may include a digital representation of the lightning pulse. The digital signal or digital data, for example, may be stored by the processor 215 in the memory 220. The digital signal or digital data, for example, may be communicated to an external device, such as the server 120, via the communication interface 225, as earth-based lightning data.

In some embodiments, the processor 215 may process the digital signal or digital data to determine a type of the associated lightning pulse. In some embodiments, the processor 215 may include one or more components of computational system 400. In some embodiments, the processor 215 may include one or more servers located in one or more locations and/or located at various distributed locations. Although the processing of the earth-based lightning data, and in particular the digital signal or digital data, to determine a type of the associated lightning pulse is described as being performed by the processor 215 at the earth-based lightning detection sensor 200, in other embodiments, the processing may be performed remotely, e.g., at the server 120 of FIG. 1. The processor 215 may more generally include any suitable processing device, such as a processor, a microprocessor, a controller, a microcontroller, a field programmable gate array (FPGA), an application specific integrated circuit (ASIC), a digital signal processor (DSP), or other suitable processing device.

In some embodiments, the memory 220 may include a disk drive, a drive array, an optical storage device, a solid-state storage device, such as random access memory ("RAM") and/or read-only memory ("ROM"), which can be programmable, flash-updateable, and/or the like.

In some embodiments, the communication interface 225 may include a modem, a network card (wireless or wired), an infrared communication device, a wireless communication device, and/or a wireless communication chipset. In some embodiments, the communication interface 225 may communicate with a wireless network such as, for example, a wireless LAN, a cellular network, a LTE network, a CDMA network, a GSM network, a microwave network, a long range Wi-Fi network, a satellite network, and/or other suitable network. The communication interface 225 may transmit data such as, for example, earth-based lightning data, to the server 120 (or another device) via the network 135 (or other network).

In some embodiments, the earth-based lightning detection sensor 200 may be mounted on a concrete ground pad, while in other embodiments, the earth-based lightning detection sensor 200 may also include non-ground mounting options. The earth-based lightning detection sensor 200 may be used to perform and/or control operation of one or more of the methods or operations of the embodiments described herein. For example, the earth-based lightning detection sensor 200 may be used to perform any calculation, solve any equation, perform any identification, and/or make any determination described herein.

In some embodiments, the earth-based lightning detection sensor 200 may include either a DC power supply 230 or an AC power supply 230.

Some embodiments described herein relate to methods to determine whether CG strokes include or are followed by CC. This and other methods and/or embodiments thereof may be implemented individually and/or in any combination of two or more.

Although illustrated as discrete blocks, various blocks may be divided into additional blocks, combined into fewer blocks, or eliminated, depending on the desired implementation.

Figure 3:
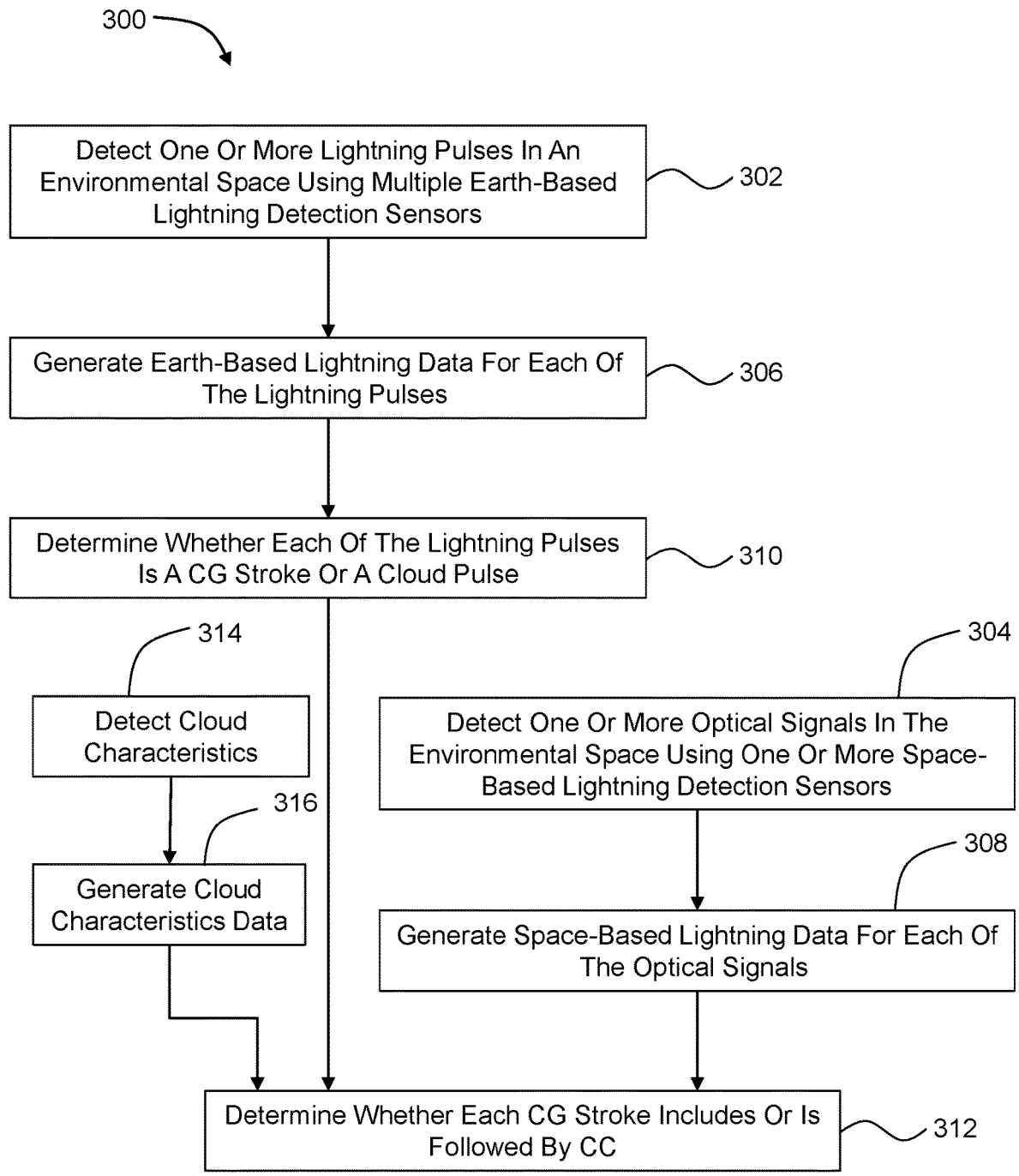
FIG. 3 is a flowchart of an example method to identify CG strokes that include or are followed by CC.

FIG. 3 is a flowchart of an example method 300 to identify CG strokes that include or are followed by CC, arranged in accordance with at least one embodiment described herein. The method 300 may be performed, in whole or in part, in the system 100 of FIG. 1, the earth-based lightning detection sensor 200 of FIG. 2, the space-based lightning detection sensor 105 of FIG. 1, and/or in other systems, devices, and/or configurations. Alternatively or additionally, some or all of the method 300 may be controlled by a computer or processor device, such as the server 120 of FIG. 1, the processor 215 of FIG. 2, and/or the computational system 400 of FIG. 4. The method 300 may include one or more of blocks 302, 304, 306, 308, 310, 312, 314, and/or 316. The method 300 may begin at block 302.

In block 302, one or more lightning pulses may be detected in an environmental space over a period of time using multiple earth-based lightning detection sensors, such as any of the earth-based lightning detection sensors 110, 115, 200 of FIG. 1 or FIG. 2. The lightning pulses may be detected by, e.g., the antenna 205 of FIG. 2 generating an analog signal representative of each lightning pulse received at the antenna 205. Block 302 may be followed by block 306.

In block 306, earth-based lightning data may be generated for each of the lightning pulses detected in the environmental space using the earth-based lightning detection sensors. The earth-based lightning data may include one or more of a geolocation of each lightning pulse, a time of occurrence of each lightning pulse, an estimate of the maximum current associated with each lightning pulse, and/or features of the time-varying voltage of each lightning pulse, such as a duration (e.g., length of time) of each lightning pulse. In an example, the earth-based lightning data may be generated by the server 120 of FIG. 1 or the processor 215 of FIG. 2 from data output by two or more of the earth-based lightning detection sensors 110 and/or 115 of FIG. 1 and/or output by the ADC 210 of FIG. 2. Block 306 may be followed by block 310.

In block 310, it may be determined whether each of the lightning pulses is a CG stroke or a cloud pulse. Block 310 may include determining that at least one of the lightning pulses is a CG stroke. The lightning pulses may be determined as CG strokes or cloud pulses based on the earth-based lightning data. For instance, the earth-based lightning data detected for each lightning pulse may include a time-varying voltage and a shape of a plot of the time-varying voltage, or other information in or derived from the earth-based lightning data for a given lightning pulse, that may be used to determine whether each lightning pulse is a cloud pulse or a CG stroke. Block 310 may be followed by block 312.

In some embodiments, block 304 and/or block 308 may be performed in parallel with one or more of blocks 302, 306, and/or 310. In block 304, one or more optical signals may be detected in the environmental space over the period of time using one or more space-based lightning detection sensors, such as the space-based lightning detection sensor 105 of FIG. 1. In some embodiments, detecting optical signals using one or more space-based lightning detection sensors may include detecting optical signals or other light emitted by the lightning pulses. Block 304 may be followed by block 308.

In block 308, space-based lightning data may be generated for each of the optical signals detected in the environmental space using the one or more space-based lightning detection sensors. The space-based lightning data may include one or more of a geolocation of each optical signal, an intensity of each optical signal, an area of each optical signal, a time of occurrence of each optical signal, and/or a duration (e.g., length of time) of each optical signal. In an example, the space-based lightning data may be generated by the space-based lightning detection sensor 105 of FIG. 1 and may be transmitted to and received by the server 120 of FIG. 1. In some embodiments, the server 120 may analyze the space-based lightning data and determine one or more contiguous groups, e.g., by assigning optical signals identified in the space-based lightning data into contiguous groups of optical signals according to any suitable algorithm, such as the algorithm described above. In other embodiments, the one or more contiguous groups may be defined by and/or included in the space-based lightning data received by the server 120 from the space-based lightning detection sensor 105. Block 308 may be followed by block 312.

In some embodiments, blocks 314 and/or 316 may be performed in parallel with one or more of blocks 302, 304, 306, 308, and/or 310. In block 314, cloud characteristics may be detected. The cloud characteristics may be detected for clouds associated with the lightning pulses and/or the optical signals. Alternatively or additionally, the cloud characteristics may be detected for clouds associated with lightning pulses that are determined to be CG strokes. The cloud characteristics may be detected by one or more sensors co-located with the space-based lightning detection sensor. In an example, the cloud characteristics may be detected by the cloud characteristic sensor 140 of FIG. 1 and/or by one or more sensors co-located with the space-based lightning detection sensor 105 of FIG. 1. Block 314 may be followed by block 316.

In block 316, cloud characteristics data may be generated. The cloud characteristics data may be generated for the clouds associated with the lightning pulses and/or the optical signals. The cloud characteristics data may include one or more of a cloud top altitude, a cloud top temperature, a cloud amount, and whether the cloud top consists primarily of ice crystals or supercooled liquid water droplets. Block 316 may be followed by block 312.

In block 312, for each CG stroke determined at block 310, it may be determined whether the CG stroke includes or is followed by CC. The determination of whether each CG stroke includes or is followed by CC may be based on the space-based lightning data generated at block 308. For instance, a given CG stroke may be determined to include or be followed by CC based on the space-based lightning data as described above.

For this and other procedures and methods disclosed herein, the functions or operations performed in the processes and methods may be implemented in differing order. Furthermore, the outlined operations are only provided as examples, and some of the operations may be optional, combined into fewer operations, supplemented with other operations, or expanded into additional operations without detracting from the disclosed embodiments.

For example, the method 300 may further include a step to correlate lightning pulses represented in the earth-based lightning data with optical signals represented in the space-based lightning data, e.g., prior to block 312. The lightning pulses and/or optical signals represented in the different types of lightning data (e.g., earth-based or space-based) may be correlated based on one or more of geolocation, time of occurrence, duration, and/or other potentially identifying features of the lightning pulses and/or optical signals.

For instance, each of the CG strokes determined at block 310 from the earth-based lightning data may have a geolocation, time of occurrence, and/or duration included in the earth-based lightning data. For each CG stroke determined from the earth-based lightning data, any combination of the geolocation, time of occurrence, and/or duration may serve as a signature or fingerprint for the CG stroke.

Analogously, each of the optical signals represented in the space-based lightning data and/or each contiguous group of optical signals may have a geolocation, time of occurrence, and/or duration included in the space-based lightning data. For each optical signal represented by the space-based lightning data or contiguous group of optical signals, any combination of the geolocation, time of occurrence, and/or duration may serve as a signature or fingerprint.

In some embodiments, the lightning pulses, including the CG strokes, represented in the earth-based lightning data may be correlated with the optical signals represented in the space-based lightning data and/or contiguous groups of optical signals by comparing the signatures or fingerprints of each. If the signature or fingerprint of a CG stroke represented in the earth-based lightning data matches, or is at least consistent with, the signature or fingerprint of an optical signal represented in the space-based lightning data or of a contiguous group of optical signals, the CG stroke represented in the earth-based lightning data may be determined to be the same as and thereby associated with, or may at a minimum be correlated with, the corresponding optical signal represented in the space-based lightning data or the corresponding contiguous group of optical signals. Thus, the intensity, duration, and/or other data of the optical signal in the space-based lightning data or of the contiguous group of optical signals may be used at block 312 to determine if the corresponding CG stroke in the earth-based lightning data includes or is followed by CC.

One or more outputs of the method 300 to determine whether CG strokes include or are followed by CC may be used to generate a warning about a potential fire. For instance, the method 300 may determine that a CG stroke includes or is followed by CC and may notify a fire department or public officials located near the CG stroke to warn of a possible fire due to the CC included in or following the CG stroke.

FIG. 4 includes a block diagram of an example computational system 400 (or processing unit), arranged in accordance with at least one embodiment described herein. The computational system 400 may be used to perform and/or control operation of any of the embodiments described herein. For example, the computational system 400 may be used alone or in conjunction with other components. As another example, the computational system 400 may be used to perform any calculation, solve any equation, perform any identification, and/or make any determination described herein. The computational system 400 is an example implementation of the server 120 of FIG. 1.

The computational system 400 may include any or all of the hardware elements shown in FIG. 4 and described herein. The computational system 400 may include hardware elements that may be electrically coupled via a bus 405 (or may otherwise be in communication, as appropriate). The hardware elements may include one or more processors 410, including one or more general-purpose processors and/or one or more special-purpose processors (such as digital signal processing chips, graphics acceleration chips, and/or other suitable processors); one or more input devices 415, which may include a mouse, a keyboard, or other suitable input device; and one or more output devices 420, which may include a display device, a printer, and/or other suitable output devices.

The computational system 400 may further include (and/or be in communication with) one or more storage devices 425, which may include local and/or network-accessible storage, a disk drive, a drive array, an optical storage device, a solid-state storage device, such as a RAM, and/or ROM, which may be programmable, flash-updateable, and/or the like. The computational system 400 might also include a communication subsystem 430, which may include a modem, a network card (wireless or wired), an infrared communication device, a wireless communication device, and/or chipset (such as a Bluetooth® device, a 802.6 device, a Wi-Fi device, a WiMAX device, cellular communication facilities, etc.), and/or the like. The communication subsystem 430 may permit data to be exchanged with a network (such as the networks described herein) and/or any other systems and/or devices described herein. In many embodiments, the computational system 400 may further include a working memory 435, which may include a RAM or ROM device, as described above.

The computational system 400 may also include software elements, which may be located within the working memory 435. Also, the computational system 400 may include an operating system 440 and/or other code, such as one or more application programs 445, which may include computer programs, and/or may be designed to implement the methods, and/or configure the systems, as described herein. For example, one or more operations or procedures described with respect to the method(s) discussed above might be implemented as code and/or instructions executable by a computer (and/or a processor within a computer). A set of these instructions and/or codes may be stored on a computer-readable storage medium, such as the storage device(s) 425 described above.

In some embodiments, the storage medium may be incorporated within the computational system 400 or in communication with the computational system 400. In other embodiments, the storage medium might be separate from the computational system 400 (e.g., a removable medium, such as a compact disc, etc.), and/or provided in an installation package, such that the storage medium may be used to program a general-purpose computer with instructions/code stored thereon. These instructions may take the form of executable code, which may be executable by the computational system 400 and/or may take the form of source and/or installable code, which, upon compilation and/or installation on the computational system 400 (e.g., using any of a variety of generally available compilers, installation programs, compression/decompression utilities, etc.), takes the form of executable code.

Various embodiments are disclosed herein. The various embodiments may be partially or completely combined to produce other embodiments.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing art to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared, or otherwise manipulated. It has proven convenient at times, principally for reasons of common usage, to refer to such signals as bits, data, values, elements, symbols, characters, terms, numbers, numerals, or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical, electronic, or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general-purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited unless context indicates otherwise. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for-purposes of example rather than limitation, and does not preclude inclusion of such modifications, variations, and/or additions to the present subject matter as would be readily apparent to one of ordinary skill in the art.

That which is claimed:

1. A method to detect cloud-to-ground (CG) strokes that include or are followed by continuing current, the method comprising:
    generating earth-based lightning data for one or more lightning pulses detected in an environmental space using a plurality of earth-based lightning detection sensors,
    receiving space-based lightning data for one or more optical signals detected in the environmental space using one or more space-based lightning detection sensors;
    determining whether each of the one or more lightning pulses is a CG stroke based on the earth-based lightning data; and
    in response to determining that a given one of the one or more lightning pulses is a CG stroke, determining whether the CG stroke includes or is followed by continuing current based on the space-based lightning data.

2. The method of claim 1, wherein the space-based lightning data represents a plurality of optical signals detected in the environmental space, the method further comprising defining a plurality of contiguous groups of optical signals, each contiguous group including two or more of the plurality of optical signals.

3. The method of claim 1, further comprising correlating lightning pulses represented in the earth-based lightning data with the plurality of contiguous groups of optical signals prior to determining if the CG stroke includes or is followed by continuing current, wherein:
    the correlating includes identifying a correlation between the CG stroke represented in the earth-based lightning data and a given one of the plurality of contiguous groups; and
    determining whether the CG stroke includes or is followed by continuing current is based on space-based lightning data specific to the given one of the plurality of contiguous groups and its corresponding optical signals represented in the space-based lightning data.

4. The method of claim 3, wherein correlating lightning pulses represented in the earth-based lightning data with the plurality of contiguous groups of optical signals comprises comparing identifying features of lightning pulses represented in the earth-based lightning data to identifying features of the plurality of contiguous groups of optical signals.

5. The method of claim 1, further comprising determining at least one of the following from the space-based lightning data received from the one or more space-based lightning detection sensors:
- a contiguous group of optical signals represented in the space-based lightning data corresponding to the CG stroke represented in the earth-based lightning data;
- a maximum intensity of each of the optical signals in the contiguous group of optical signals;
- a sum of intensities of all of the optical signals in the contiguous group of optical signals;
- an area of each of the optical signals in the contiguous group of optical signals;
- a sum of areas of all of the optical signals in the contiguous group of optical signals; and
- a duration of the contiguous group of optical signals.

6. The method of claim 5, wherein determining whether the CG stroke includes or is followed by continuing current based on the space-based lightning data comprises determining at least one of:
- whether the maximum intensity for one or more of the optical signals in the contiguous group of optical signals exceeds a threshold intensity;
- whether the sum of intensities of the optical signals in the contiguous group of optical signals exceeds a threshold sum intensity;
- whether the area of one or more of the optical signals in the contiguous group of optical signals exceeds a threshold area;
- whether the sum of areas of all of the optical signals in the contiguous group of optical signals exceeds a threshold sum of areas; and
- whether the duration for the contiguous group of optical signals exceeds a threshold duration.

7. The method of claim 1, further comprising detecting the one or more lightning pulses in the environmental space using the plurality of earth-based lightning detection sensors, wherein detecting the one or more lightning pulses in the environmental space using the plurality of earth-based lightning detection sensors comprises capturing video data for each of the one or more lightning pulses.

8. The method of claim 1, further comprising detecting the one or more lightning pulses in the environmental space using the plurality of earth-based lightning detection sensors, wherein detecting the one or more lightning pulses in the environmental space comprises detecting the one or more lightning pulses in a range between thirty kilohertz and three hundred kilohertz.

9. A non-transitory computer-readable medium having computer-readable instructions stored thereon that are executable by a processor device to perform or control performance of operations comprising:
- generating earth-based lightning data for one or more lightning pulses detected in an environmental space using a plurality of earth-based lightning detection sensors,
- receiving space-based lightning data for one or more optical signals detected in the environmental space using one or more space-based lightning detection sensors;
- determining whether each of the one or more lightning pulses is a CG stroke based on the earth-based lightning data; and
- in response to determining that a given one of the one or more lightning pulses is a CG stroke, determining whether the CG stroke includes or is followed by continuing current based on the space-based lightning data.

10. The non-transitory computer-readable medium of claim 9, wherein the space-based lightning data represents a plurality of optical signals detected in the environmental space, and wherein the operations further comprise defining a plurality of contiguous groups of optical signals, each contiguous group including two or more of the plurality of optical signals.

11. The non-transitory computer-readable medium of claim 10, wherein:
- the operations further comprise correlating lightning pulses represented in the earth-based lightning data with the plurality of contiguous groups of optical signals prior to determining if the CG stroke includes or is followed by continuing current;
- the correlating includes identifying a correlation between the CG stroke represented in the earth-based lightning data and a given one of the plurality of contiguous groups; and
- determining whether the CG stroke includes or is followed by continuing current is based on space-based lightning data specific to the given one of the plurality of contiguous groups and its corresponding optical signals represented in the space-based lightning data.

12. The non-transitory computer-readable medium of claim 11, wherein correlating lightning pulses represented in the earth-based lightning data with the plurality of contiguous groups of optical signals comprises comparing identifying features of lightning pulses represented in the earth-based lightning data to identifying features of the plurality of contiguous groups of optical signals.

13. The non-transitory computer-readable medium of claim 9, wherein the operations further comprise determining at least one of the following from the space-based lightning data received from the one or more space-based lightning detection sensors:
- a contiguous group of optical signals represented in the space-based lightning data corresponding to the CG stroke represented in the earth-based lightning data;
- a maximum intensity of each of the optical signals in the contiguous group of optical signals;
- a sum of intensities of all of the optical signals in the contiguous group of optical signals;
- an area of each of the optical signals in the contiguous group of optical signals;
- a sum of areas of all of the optical signals in the contiguous group of optical signals; and
- a duration of the contiguous group of optical signals.

14. The non-transitory computer-readable medium of claim 13, wherein determining whether the CG stroke includes or is followed by continuing current based on the space-based lightning data comprises determining at least one of:
- whether the maximum intensity for one or more of the optical signals in the contiguous group of optical signals exceeds a threshold intensity;
- whether the sum of intensities of the optical signals in the contiguous group of optical signals exceeds a threshold sum intensity;

whether the area of one or more of the optical signals in the contiguous group of optical signals exceeds a threshold area;

whether the sum of areas of all of the optical signals in the contiguous group of optical signals exceeds a threshold sum of areas; and whether the duration for the contiguous group of optical signals exceeds a threshold duration.

15. A lightning detection system, comprising:
a plurality of earth-based lightning detection sensors configured to detect one or more lightning pulses in an environmental space; and
a processor device communicatively coupled to the plurality of earth-based lightning detection sensors and to one or more space-based lightning detection sensors configured to detect one or more optical signals in the environmental space, wherein the processor device is configured to perform or control performance of operations comprising:
generating earth-based lightning data for the one or more lightning pulses,
receiving space-based lightning data for the one or more optical signals;
determining whether each of the one or more lightning pulses is a CG stroke based on the earth-based lightning data; and
in response to determining that a given one of the one or more lightning pulses is a CG stroke, determining whether the CG stroke includes or is followed by continuing current based on the space-based lightning data.

16. The lightning detection system of claim 15, wherein the space-based lightning data represents a plurality of optical signals detected in the environmental space by the one or more space-based lightning detection sensors, and wherein the operations further comprise defining a plurality of contiguous groups of optical signals, each contiguous group including two or more of the plurality of optical signals.

17. The lightning detection system of claim 16, wherein:
the operations further comprise correlating lightning pulses represented in the earth-based lightning data with the plurality of contiguous groups of optical signals prior to determining if the CG stroke includes or is followed by continuing current;
the correlating includes identifying a correlation between the CG stroke represented in the earth-based lightning data and a given one of the plurality of contiguous groups; and
determining whether the CG stroke includes or is followed by continuing current is based on space-based lightning data specific to the given one of the plurality of contiguous groups and its corresponding optical signals represented in the space-based lightning data.

18. The lightning detection system of claim 17, wherein correlating lightning pulses represented in the earth-based lightning data with the plurality of contiguous groups of optical signals comprises comparing identifying features of lightning pulses represented in the earth-based lightning data to identifying features of the plurality of contiguous groups of optical signals.

19. The lightning detection system of claim 15, the operations further comprising determining at least one of the following from the space-based lightning data received from the one or more space-based lightning detection sensors:
a contiguous group of optical signals represented in the space-based lightning data corresponding to the CG stroke represented in the earth-based lightning data;
a maximum intensity of each of the optical signals in the contiguous group of optical signals;
a sum of intensities of all of the optical signals in the contiguous group of optical signals;
an area of each of the optical signals in the contiguous group of optical signals;
a sum of areas of all of the optical signals in the contiguous group of optical signals; and
a duration of the contiguous group of optical signals.

20. The lightning detection system of claim 19, wherein determining whether the CG stroke includes or is followed by continuing current based on the space-based lightning data comprises determining at least one of:
whether the maximum intensity for one or more of the optical signals in the contiguous group of optical signals exceeds a threshold intensity;
whether the sum of intensities of the optical signals in the contiguous group of optical signals exceeds a threshold sum intensity;
whether the area of one or more of the optical signals in the contiguous group of optical signals exceeds a threshold area;
whether the sum of areas of all of the optical signals in the contiguous group of optical signals exceeds a threshold sum of areas; and
whether the duration for the contiguous group of optical signals exceeds a threshold duration.

* * * * *